US008564393B2

(12) United States Patent
Nishikawa et al.

(10) Patent No.: US 8,564,393 B2
(45) Date of Patent: Oct. 22, 2013

(54) COIL COMPONENT AND METHOD OF MANUFACTURING THE SAME

(75) Inventors: Tomonaga Nishikawa, Tokyo (JP); Makoto Yoshida, Tokyo (JP); Tomokazu Ito, Tokyo (JP); Hiroshi Kamiyama, Tokyo (JP); Takeshi Okumura, Tokyo (JP); Sho Nakagomi, Tokyo (JP)

(73) Assignee: TDK Corporation, Tokyo (JP)

( * ) Notice: Subject to any disclaimer, the term of this patent is extended or adjusted under 35 U.S.C. 154(b) by 8 days.

(21) Appl. No.: 13/293,841

(22) Filed: Nov. 10, 2011

(65) Prior Publication Data

US 2012/0112869 A1 May 10, 2012

(30) Foreign Application Priority Data

Nov. 10, 2010 (JP) ................................ 2010-252189

(51) Int. Cl.

| | |
|---|---|
| ***H01F 5/00*** | (2006.01) |
| ***H01F 27/30*** | (2006.01) |
| ***H01F 27/28*** | (2006.01) |
| ***H01F 7/06*** | (2006.01) |
| ***H01L 27/08*** | (2006.01) |

(52) U.S. Cl.

USPC ........... 336/200; 336/199; 336/232; 257/531; 29/602.1

(58) Field of Classification Search

USPC ........... 336/199, 200, 232; 257/531; 29/602.1

See application file for complete search history.

(56) References Cited

U.S. PATENT DOCUMENTS

| | | | | |
|---|---|---|---|---|
| 5,071,509 | A * | 12/1991 | Kano et al. | 216/18 |
| 5,761,791 | A * | 6/1998 | Bando | 29/609 |
| 5,973,390 | A * | 10/1999 | Amaya et al. | 257/678 |
| 6,194,248 | B1 * | 2/2001 | Amaya et al. | 438/110 |
| 7,843,044 | B2 * | 11/2010 | Takahashi et al. | 257/673 |
| 7,843,701 | B2 | 11/2010 | Kudo et al. | |
| 8,123,882 | B2 * | 2/2012 | Kishida et al. | 156/77 |
| 8,173,565 | B2 * | 5/2012 | Katsube | 501/135 |
| 8,174,349 | B2 * | 5/2012 | Yoshida et al. | 336/200 |
| 8,231,961 | B2 * | 7/2012 | Yokoyama et al. | 428/210 |
| 2007/0040163 | A1 | 2/2007 | Okuzawa et al. | |

FOREIGN PATENT DOCUMENTS

| | | |
|---|---|---|
| JP | 2000-114047 A | 4/2000 |
| JP | 2007-053254 | 3/2007 |
| JP | 2007-066973 A | 3/2007 |
| JP | 2010-062502 A | 3/2010 |
| WO | WO 2006/073029 A1 | 7/2006 |
| WO | WO-2010/087220 A1 | 8/2010 |

* cited by examiner

*Primary Examiner* — Lincoln Donovan
*Assistant Examiner* — Joselito Baisa
(74) *Attorney, Agent, or Firm* — McDermott Will & Emery LLP

(57) ABSTRACT

A coil component 100 is provided with a substrate 11, a thin-film coil layer 12 provided on the substrate 11, first and second bump electrodes 13*a*, 13*b* provided on a surface of the thin-film coil layer 12, a first lead conductor 20 provided on the surface of the thin-film coil layer 12 together with the first and second bump electrodes 13*a*, 13*b* and formed integrally with the first bump electrode 13*a*, and an insulator layer 14 provided between the first bump electrode 13*a* and the second bump electrode 13*b*. The thin-film coil layer 12 contains a first spiral conductor 16 which is a plane coil pattern. The first bump electrode 13*a* is connected to an internal peripheral end of the first spiral conductor 16 via the first lead conductor 20. The second bump electrode 13*b* is connected to an external peripheral end of the first spiral conductor 16.

16 Claims, 12 Drawing Sheets

COIL COMPONENT AND METHOD OF MANUFACTURING THE SAME

TECHNICAL FIELD

The present invention relates to a coil component and a method of manufacturing the coil component, and in particular, relates to a structure of a thin-film common mode filter containing coil conductor and a manufacturing method thereof.

BACKGROUND OF THE INVENTION

In recent years, the standards of USB 2.0 and IEEE1394 are widely distributed as high-speed signal transmission interfaces and used in a large number of digital devices such as personal computers and digital cameras. These interfaces adopt the differential transmission method that transmits a differential signal by using a pair of signal lines to realize faster signal transmission than the conventional single end transmission method.

A common mode filter is widely used as a filter to remove noise on a high-speed differential transmission line. The common mode filter has characteristics that the impedance to a differential component of signals transmitted in a pair of signal lines is low and the impedance to a common mode component (common mode noise) is high. Therefore, by inserting a common mode filter between a pair of signal lines, common mode noise can be cut off without substantially attenuating a differential mode signal.

FIG. 12 is a schematic exploded perspective view showing an example of the structure of a conventional surface-mounted common mode filter.

As shown in FIG. 12, a conventional common mode filter 1 includes a thin-film coil layer 2 containing a pair of spiral conductors 5, 6 that are mutually electromagnetically coupled and magnetic substrates 3*a*, 3*b* provided above and below the thin-film coil layer 2 and made of ferrite. The thin-film coil layer 2 includes first to fourth insulating layers 2*a* to 2*d* stacked sequentially, a first spiral conductor 5 formed on the surface of the first insulating layer 2*a*, a second spiral conductor 6 formed on the surface of the second insulating layer 2*b*, and first and second lead conductors 8*a*, 8*b* formed on the surface of the third insulating layer 2*c*.

An internal peripheral end 5*a* of the first spiral conductor 5 is connected to a first external terminal electrode 7*a* via a contact hole conductor 9*a* passing through the second and third insulating layers 2*b*, 2*c* and the first lead conductor 8*a* and an internal peripheral end 6*a* of the second spiral conductor 6 is connected to a third external terminal electrode 7*c* via a contact hole conductor 9*b* passing through the third insulating layers 2*c* and the second feeder conductor 8*b*. External peripheral ends 5*b*, 6*b* of the first and second spiral conductors 5, 6 are connected to external terminal electrodes 7*b*, 7*d* respectively. The external terminal electrodes 7*a* to 7*d* are formed on side faces and upper and lower surfaces of the magnetic substrates 3*a*, 3*b*. The external terminal electrodes 7*a* to 7*d* are normally formed by sputtering or plating of the surface of the magnetic substrates 3*a*, 3*b*.

An opening 2*h* passing through the first to fourth insulating layers 2*a* to 2*d* is provided in a central region of the first to fourth insulating layers 2*a* to 2*d* and on an inner side of the first and second spiral conductors 5, 6 and a magnetic core 4 to form a magnetic circuit is formed inside the opening 2*h*.

WO 2006/073029 discloses a terminal electrode structure of a common mode filter. The terminal electrode of the common mode filter has an Ag film formed by applying a conductive paste containing Ag to the surface of a component or by sputtering or vapor deposition and then a metal film of Ni is further formed by performing wet type electrolytic plating on the Ag film.

Japanese Patent Application Laid-Open No. 2007-53254 discloses a common mode choke coil having an outer shape of rectangular parallelepiped as a whole by successively forming an insulating layer, a coil layer containing a coil conductor, and an external electrode electrically connected to the coil conductor on a silicon substrate by thin-film formation technology. In the common mode choke coil, the external electrode is formed by extending on the upper surface (mounting surface) of the insulating layer. An internal electrode terminal is constituted as an electrode of a multi-layered structure in which a plurality of conductive layers is stacked.

The conventional common mode filter 1 shown in FIG. 12 has a structure in which the thin-film coil layer 2 is sandwiched between the two magnetic substrates 3*a*, 3*b* and thus has not only high magnetic properties and excellent high-frequency properties, but also high mechanical strength. However, the structure of the conventional common mode filter uses the upper and lower magnetic substrates 3*a*, 3*b* made of ferrite and a ferrite substrate is easy to break when thinned too much, making slimming-down of the substrate difficult. Further, the filter is made thicker by the two magnetic substrates 3*a*, 3*b* being stacked, which makes it difficult to provide as a lowered chip product. Moreover, a large amount of expensive magnetic materials is used, posing problems of high manufacturing costs and excessive specs of filter performance depending on uses.

Moreover, the conventional common mode filter 1 has the four micro external terminal electrodes 7*a* to 7*d* formed on the surface of individual chip components by sputtering or the like, posing a problem that it is very difficult to form the external terminal electrodes 7*a* to 7*d* with high precision. Further, the internal electrode terminal is formed of many stacked conductor layers in a common mode choke coil described in Japanese Patent Application Laid-Open No. 2007-53254 and thus, the probability of a failed electrode being formed is high and a problem of increased manufacturing costs due to an increase in man-hour for the electrode formation is caused.

SUMMARY OF THE INVENTION

It is therefore an object of the present invention to provide a coil component that can be miniaturized, lowered, and manufactured at a low cost while desired filter performance being secured. Another object of the present invention is to provide a method of manufacturing a coil component capable of manufacturing such a coil component easily and at a low cost.

To solve the above problems, a coil component according to the present invention includes a substrate, a thin-film coil layer provided on the substrate, first and second bump electrodes provided on a surface of the thin-film coil layer, a first lead conductor provided on the surface of the thin-film coil layer together with the first and second bump electrodes and formed integrally with the first bump electrode, and an insulator layer provided between the first bump electrode and the second bump electrode, wherein the thin-film coil layer contains a first spiral conductor, which is a plane coil pattern, the first bump electrode is connected to an internal peripheral end of the first spiral conductor via the first lead conductor, and the second bump electrode is connected to an external peripheral end of the first spiral conductor.

According to the present invention, a thin coil component whose one substrate is omitted can be provided at a low cost. An electrode can be formed with higher precision than in the past because a bump electrode for which two-dimensional management with high precision is possible is used as an external terminal electrode. Also, an insulator layer is provided around the bump electrode and therefore, the bump electrode can be reinforced to prevent peeling of the bump electrode. Further, a portion of the bump electrode overlaps with the spiral conductor in plane view and therefore, the coil component can be miniaturized.

Further, according to the present invention, when a lead conductor is formed in a thin-film coil layer, a dedicated insulating layer required in the past can be omitted so that still thinner coil components can be provided. With one layer of the insulating layer omitted, the distance between the insulator layer made of, for example, composite ferrite and the thin-film coil layer is brought closer to each other as a common mode filter so that the common mode impedance can be increased. Further, material costs and man-hours are reduced with the omission of the insulating layer and an independent lead conductor and therefore, coil components that can be manufactured at a low cost can be provided. Further, a terminal electrode pattern for a portion of lead conductors conventionally formed in the thin-film coil layer is no longer needed and the terminal electrode pattern can be removed so that a coil arrangement region can be increased. Therefore, a DC resistance Rdc can be reduced by broadening the line width of the spiral conductor. Also, by increasing the number of turns of the spiral conductor, a common mode impedance Zc can be increased.

In the present invention, it is preferable that a height of the first lead conductor is lower than that of the first bump electrode. According to the configuration, the first and second bump electrodes can be exposed and only the first lead conductor can be buried under the insulator layer so that a good-looking terminal electrode pattern can be provided.

In the present invention, the first bump electrode and the second bump electrode preferably have the same plane shape. According to the configuration, the bump electrode is symmetric and thus, a terminal electrode pattern that is free from constrained mounting orientation can be provided.

The coil component according to the present invention further preferably includes third and fourth bump electrodes provided on the surface of the thin-film coil layer and a second lead conductor provided on the surface of the thin-film coil layer together with the third and fourth bump electrodes and formed integrally with the third bump electrode, wherein the thin-film coil layer further contains a second spiral conductor composed of a plane coil pattern magnetically coupled to the first spiral conductor, the insulator layer is provided between the first to fourth bump electrodes, the third bump electrode is connected to an internal peripheral end of the second spiral conductor via the second lead conductor, and the fourth bump electrode is connected to an external peripheral end of the second spiral conductor.

According to the configuration, a common mode filter achieving the above operation/effect can be provided. While the demand for miniaturization of the common mode filter is strong, the area of individual external terminal electrodes is unavoidably small due to a 4-terminal structure. However, if the external terminal electrode is formed as a bump electrode, the bump electrode can be formed with high dimensional accuracy so that insulation between adjacent terminal electrodes can be secured. Further, according to the present invention, the insulator layer between the bump electrode and the lead conductor can be omitted so that thinner coil components can be provided. With one layer of the insulating layer omitted, the distance between the insulator layer made of, for example, composite ferrite and the thin-film coil layer is brought closer to each other so that the common mode impedance can be increased. Further, material costs and man-hours are reduced with the omission of the insulating layer and an independent lead conductor and therefore, coil components can be provided at a low cost. Further, a terminal electrode pattern for lead conductors conventionally formed in the thin-film coil layer is no longer needed and the terminal electrode pattern can be removed so that a coil arrangement region can be increased. Therefore, the DC resistance Rdc can be reduced by broadening the line width of the spiral conductor. Also, by increasing the number of turns of the spiral conductor, the common mode impedance Zc can be increased.

To solve the above problems, a method of manufacturing a coil component according to the present invention includes a step of forming a thin-film coil layer containing a spiral conductor, which is a plane coil pattern, on a substrate made of, for example, a ceramic material and a step of forming a bump electrode and a lead conductor on the thin-film coil layer, wherein the step of forming the bump electrode and the lead conductor includes a step of forming a base conductive film on a surface of the thin-film coil layer and a step of forming the bump electrode and the lead conductor at the same time by, after a first region excluding a predetermined region to form the bump electrode and the lead conductor being covered with a first mask, growing the base conductive film in a region where the bump electrode should be formed to a predetermined thickness appropriate for the bump electrode by plating.

According to the method, a lead conductor and first and second bump electrodes can be formed by electroplating at a time and therefore, costs can be reduced by decreasing man-hours.

Furthermore, a method of manufacturing a coil component according to the present invention includes a step of forming a thin-film coil layer containing a spiral conductor, which is a plane coil pattern, on a substrate made of, for example, a ceramic material and a step of forming a bump electrode and a lead conductor on the thin-film coil layer, wherein the step of forming the bump electrode and the lead conductor includes a step of forming a base conductive film on a surface of the thin-film coil layer, a step of forming a lower part of the bump electrode and the lead conductor at the same time by, after a first region excluding a predetermined region to form the bump electrode and the lead conductor being covered with a first mask, growing an exposure portion of the base conductive film to a predetermined thickness appropriate for the lead conductor by plating, and a step of growing the lower part of the bump electrode to a predetermined thickness appropriate for the bump electrode by plating after a second region excluding the predetermined region to form the bump electrode being covered with a second mask.

According to the method, only a first lead conductor can be buried under the insulator layer while first and second bump electrodes being exposed and, therefore, coil components having a good-looking terminal electrode pattern can reliably be manufactured.

According to the present invention, a coil component that can be miniaturized, lowered, and manufactured at a low cost while securing desired filter performance can be provided. Further, according to the present invention, a manufacturing method capable of manufacturing such coil components easily at a low cost can be provided.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be described in detail below with reference to the accompanying drawings.

Figure 1:
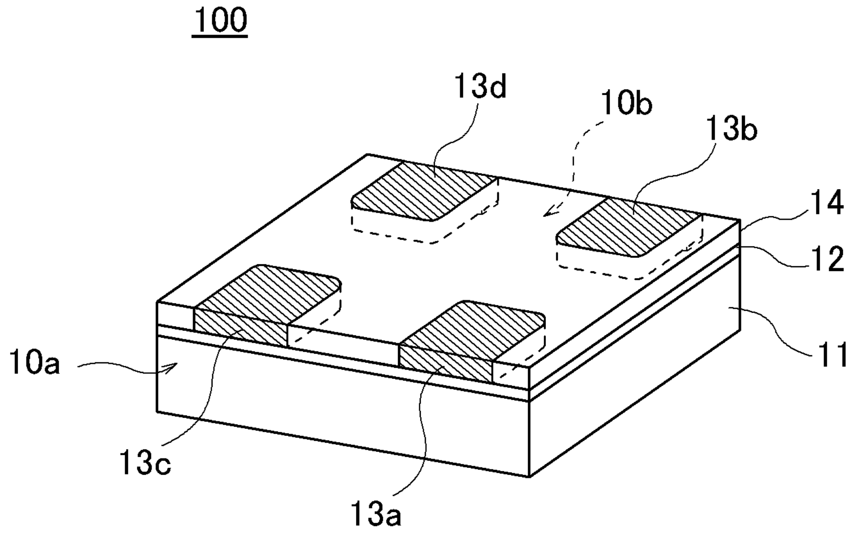
FIG. 1 is a schematic perspective view showing an appearance structure of a coil component 100 according to a first embodiment of the present invention.

FIG. 1 is a schematic perspective view showing an overview structure of the coil component 100 according to the first embodiment of the present invention and shows a state in which a mounting surface is directed upward.

As shown in FIG. 1, the coil component 100 according to the present embodiment is a common mode filter and includes a substrate 11, the thin-film coil layer 12 containing a common mode filter element provided on one principal surface (top surface) of the substrate 11, first to fourth bump electrodes 13*a* to 13*d* provided on the principal surface (top surface) of the thin-film coil layer 12, and an insulator layer 14 provided on the principal surface of the thin-film coil layer 12 excluding formation positions of the bump electrodes 13*a* to 13*d*.

The coil component 100 is a surface-mounted chip component in a shape of substantially rectangular parallelepiped and the first to fourth bump electrodes 13*a* to 13*d* are formed so as to be also exposed to an outer circumferential surface of a layered product composed of the substrate 11, the thin-film coil layer 12, and the insulator layer 14. Of these bump electrodes, the first and third bump electrodes 13*a*, 13*c* are exposed from a first side face 10*a* parallel to the longitudinal direction of the layered product and the second and fourth bump electrodes 13*b*, 13*d* are exposed from a second side face 10*b* opposite to the first side face 10*a*. The coil component 100 is turned upside down for mounting to be used with the side of the bump electrodes 13*a* to 13*d* directed in a downward direction.

The substrate 11 ensures mechanical strength of the coil component 100 and also serves as a closed magnetic circuit of the common mode filter. A magnetic ceramic material, for example, sintered ferrite can be used as the material of the substrate 11. Though not particularly limited, when the chip size is 1.0×1.25×0.6 (mm), the thickness of the substrate 11 can be set to about 0.35 to 0.4 mm.

The thin-film coil layer 12 is a layer containing a common mode filter element provided between the substrate 11 and the insulator layer 14. The thin-film coil layer 12 has, as will be described in detail later, a multi-layered structure formed by an insulating layer and a conductor pattern being alternately stacked. Thus, the coil component 100 according to the present embodiment is a so-called thin-film type coil component and is to be distinguished from a wire wound type having a structure in which a conductor wire is wound around a magnetic core.

The insulator layer 14 is a layer constituting a mounting surface (bottom face) of the coil component 100 and protects the thin-film coil layer 12 together with the substrate 11 and also serves as a closed magnetic circuit of the coil component 100. However, mechanical strength of the insulator layer 14 is weaker than that of the substrate 11 and plays only a supplementary role in terms of strength. An epoxy resin (composite ferrite) containing ferrite powder can be used as the insulator layer 14. Though not particularly limited, when the chip size is 1.0×1.25×0.6 (mm), the thickness of the insulator layer 14 can be set to about 0.08 to 0.1 mm.

Figure 2:
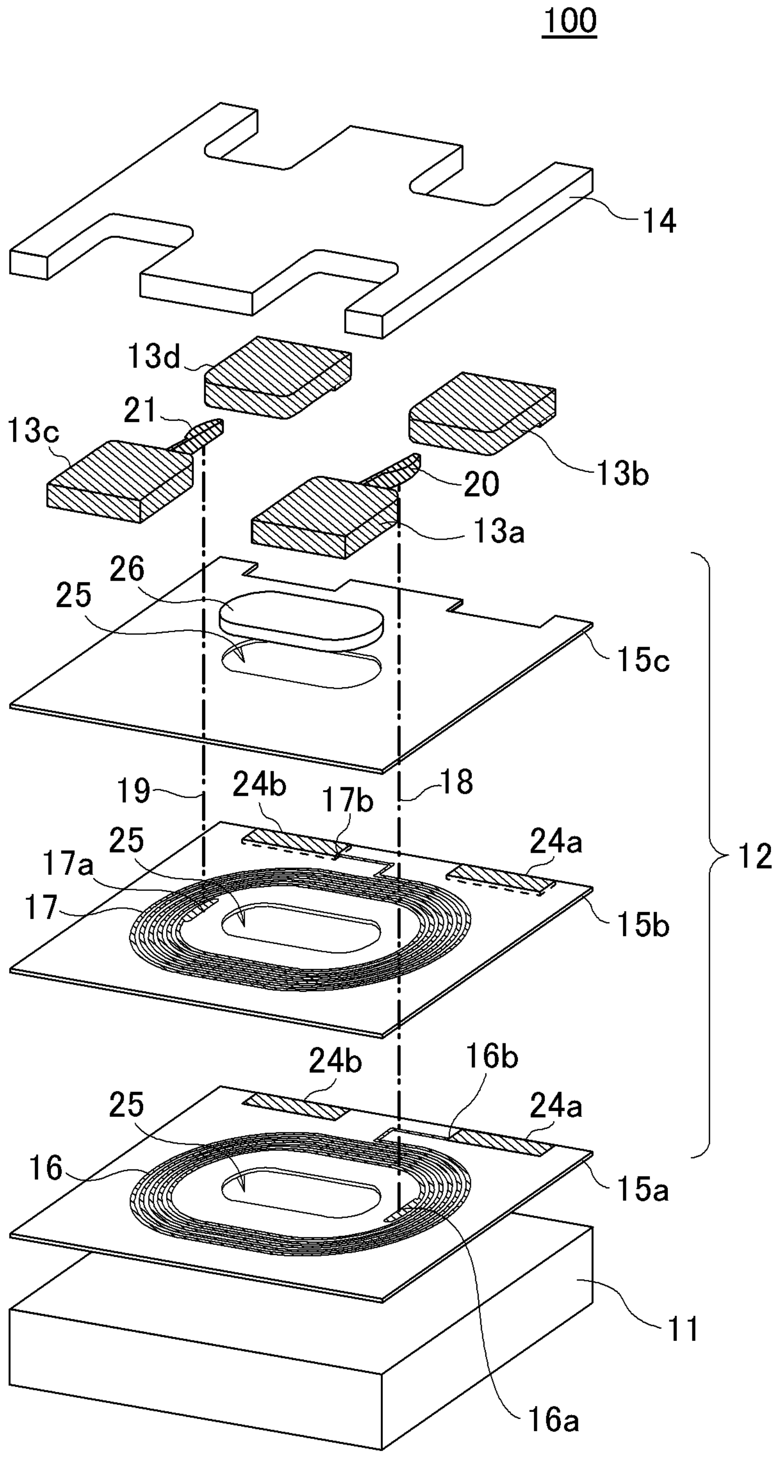
FIG. 2 is a schematic exploded perspective view showing a layer structure of the coil component 100 in detail.

FIG. 2 is a schematic exploded perspective view showing a layer structure of the coil component 100 in detail.

As shown in FIG. 2, the thin-film coil layer 12 includes first to third insulating layers 15*a* to 15*c* sequentially stacked from the substrate 11 side toward the insulator layer 14 side, a first spiral conductor 16 and terminal electrodes 24*a*, 24*b* formed on the first insulating layer 15*a*, a second spiral conductor 17 and the terminal electrodes 24*a*, 24*b* formed on the second insulating layer 15*b*. The number of insulating layers is still smaller than that in the conventional technology shown in FIG. 16.

The first to third insulating layers 15*a* to 15*c* insulate spiral conductor patterns provided in different layers and also serve to secure flatness of the plane on which spiral conductor patterns are formed. Particularly, the first insulating layer 15*a* serves to increase the accuracy of finishing spiral conductor patterns by absorbing unevenness of the surface of the substrate 11. It is preferable to use a resin excellent in electric and magnetic insulation properties and easy to work on as the material of the insulating layers 15*a* to 15*c* and though not particularly limited, a polyimide resin or epoxy resin can be used.

An internal peripheral end 16*a* of the first spiral conductor 16 is connected to a first lead conductor 20 and the first bump electrode 13*a* via a first contact hole 18 passing through the second and third insulating layers 15*b*, 15*c*. An external peripheral end 16*b* of the first spiral conductor 16 is connected to the first terminal electrode 24*a*.

An internal peripheral end 17*a* of the second spiral conductor 17 is connected to a second lead conductor 21 and the third bump electrode 13*c* via a second contact hole 19 passing through the third insulating layer 15*c*. An external peripheral end 17*b* of the second spiral conductor 17 is connected to the second terminal electrode 24*b*.

In the present embodiment, terminal electrodes connected to the internal peripheral ends 16*a*, 17*a* of the first and second spiral conductors 16, 17 are not provided on the first to third insulating layers 15*a* to 15*c*. This is because, as described above, the internal peripheral ends 16*a*, 17*a* of the first and second spiral conductors 16, 17 are connected to the first and third bump electrodes 13*a*, 13*c* via the first and second contact holes 18, 19 respectively without passing through end faces of the first to third insulating layers 15*a* to 15*c*. If terminal electrodes are formed on one side (side face 10*b* side in FIG. 1) of the first to third insulating layers 15*a* to 15*c*, a margin space without terminal electrode pattern is created on the opposite side (side face 10*a* side in FIG. 1) so that a coil arrangement region can be increased. Therefore, a DC resistance Rdc can be reduced by making the line width of the spiral conductors 16, 17 wider. Also, a common mode impedance Zc can be increased by increasing the number of turns of the spiral conductors 16, 17.

The first and the second spiral conductors 16, 17 have the same plane shape and are provided in the same position in plane view. The first and the second spiral conductors 16, 17 overlap completely and thus, strong magnetic coupling is generated between both conductors. With the above configuration, a conductor pattern in the thin-film coil layer 12 constitutes a common mode filter.

The first and the second spiral conductors 16, 17 have both a circular spiral outer shape. A circular spiral conductor attenuates less at high frequencies and thus can be used preferably as a high-frequency inductance. The spiral conductors 16, 17 according to the present embodiment have an oblong shape, but may also have a complete round shape or elliptic shape. Alternatively, the spiral conductors 16, 17 may have a substantially rectangular shape. The above conductor patterns are formed by patterning using sputtering or plating and Cu, Ag, Au and the like can be used, but Cu is preferably used.

An opening 25 passing through the first to third insulating layers 15*a* to 15*c* is provided in the central region of the first to third insulating layers 15*a* to 15*c* and on the inner side of the first and second spiral conductors 16, 17 and a magnetic core 26 to form a magnetic circuit is formed inside the opening 25. It is preferable to use a magnetic powder containing resin (composite ferrite), which is the same material as that of the insulator layer 14, as the material of the magnetic core 26.

The first to fourth bump electrodes 13*a* to 13*d* and the first and second lead conductors 20, 21 are provided on the insulating layer 15*c* constituting the surface layer of the thin-film coil layer 12. The second bump electrode 13*b* is connected to the terminal electrode 24*a* and the fourth bump electrode 13*d* is connected to the terminal electrode 24*b*. The "bump electrode" herein means, in contrast to an electrode formed by thermally compressing a metal ball of Cu, Au or the like using a flip chip bonder, a thick-film plated electrode formed by plating. The thickness of the bump electrode is equal to the thickness of the insulator layer 14 or more and can be set to about 0.08 to 0.1 mm. That is, the thickness of the bump electrodes 13*a* to 13*d* is thicker than a conductor pattern in the thin-film coil layer 12 and particularly has a thickness five times or more than a spiral conductor pattern in the thin-film coil layer 12.

In the present embodiment, the first and second lead conductors 20, 21 are formed on the surface of the third insulating layer 15*c* of the thin-film coil layer 12 together with the first to fourth bump electrodes 13*a* to 13*d*. The first lead conductor 20 is provided integrally in the same layer as the first bump electrode 13*a* and the third lead conductor 21 is provided integrally in the same layer as the third bump electrode 13*c*. Therefore, one layer of the dedicated insulating layer 2*d* to form the first and second lead conductors 8*a*, 8*b* provided in the conventional coil component shown in FIG. 16 can be omitted so that a still thinner coil component can be provided at a low cost.

The insulator layer 14 is formed on the third insulating layer 15*c* on which the first to fourth bump electrodes 13*a* to 13*d* and the first and second lead conductors 20, 21 are formed. The insulator layer 14 is provided like filling in surroundings of the bump electrodes 13*a* to 13*d*. The first and second lead conductors 20, 21 are lower than the bump electrodes 13*a*, 13*c* and thus are buried under the insulator layer 14 and are not exposed to the surface. Therefore, a good-looking terminal electrode pattern can be provided. Incidentally, the first and second lead conductors 20, 21 may be made as high as the bump electrodes 13*a* to 13*d* and in that case, the lead conductors 20, 21 are also exposed together with the bump electrodes 13*a* to 13*d*. Even with such a configuration, however, no short-circuit between bump electrodes, causing no practical problem.

Figure 3:
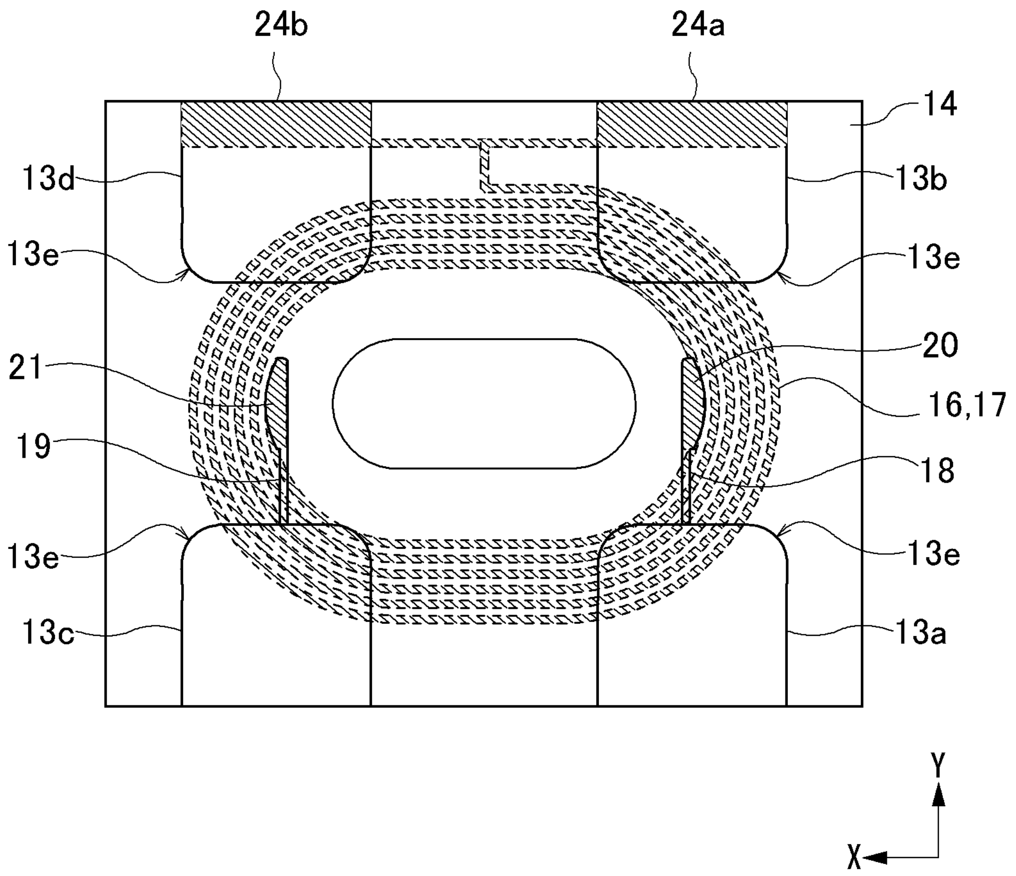
FIG. 3 is a schematic plan view showing a spatial relationship between a conductor pattern in the thin-film coil layer 12 and the bump electrodes 13*a* to 13*d;*

FIG. 3 is a schematic plan view showing a spatial relationship between a pattern of the spiral conductors 16, 17 in the thin-film coil layer 12 and the bump electrodes 13*a* to 13*d*.

As shown in FIG. 3, the first and the second spiral conductors 16, 17 both form a plane spiral counterclockwise from the internal peripheral end toward the external peripheral end and overlap completely in plane view and thus, strong magnetic coupling is generated between both conductors. Also in the present embodiment, a part of the first to fourth bump electrodes 13*a* to 13*d* overlaps with the spiral conductors 16, 17. It is necessary to secure a certain level of area on the mounting surface side of the bump electrodes 13*a* to 13*d* to ensure soldering to a printed board and if the bump electrodes 13*a* to 13*d* are arranged so as to overlap with the spiral conductors 16, 17, the electrode area can be secured without increasing the chip area. It is also possible to configure so that the bump electrodes 13*a* to 13*d* do not overlap with the spiral conductors 16, 17, but in that case, chip components will become larger.

A side face 13*e* of the bump electrodes 13*a* to 13*d* in contact with the insulator layer 14 preferably has, as illustrated in FIG. 3, a curved shape without edges. As will be described in detail later, after the bump electrodes 13 are formed, the insulator layer 14 is formed by pouring a paste of composite ferrite and if, at this point, the side face 13*e* of the bump electrodes 13*a* to 13*d* has an edged corner, surroundings of the bump electrodes are not completely packed with the paste and bubbles are more likely to be contained. However, if the side faces of the bump electrodes 13*a* to 13*d* are curved, a fluid resin reaches every corner so that a closely packed insulator layer 14 containing no bubbles can be formed. Moreover, adhesiveness between the insulator layer 14 and the bump electrodes 13*a* to 13*d* is increased so that reinforcement for the bump electrodes 13*a* to 13*d* can be increased.

In the present embodiment, the first to fourth bump electrodes 13*a* to 13*d* have substantially same plane shape. According to the configuration, the bump electrode pattern in the bottom surface of the coil component 100 is symmetric and thus, a terminal electrode pattern that is free from constrained mounting orientation and good-looking can be provided.

Figure 4:
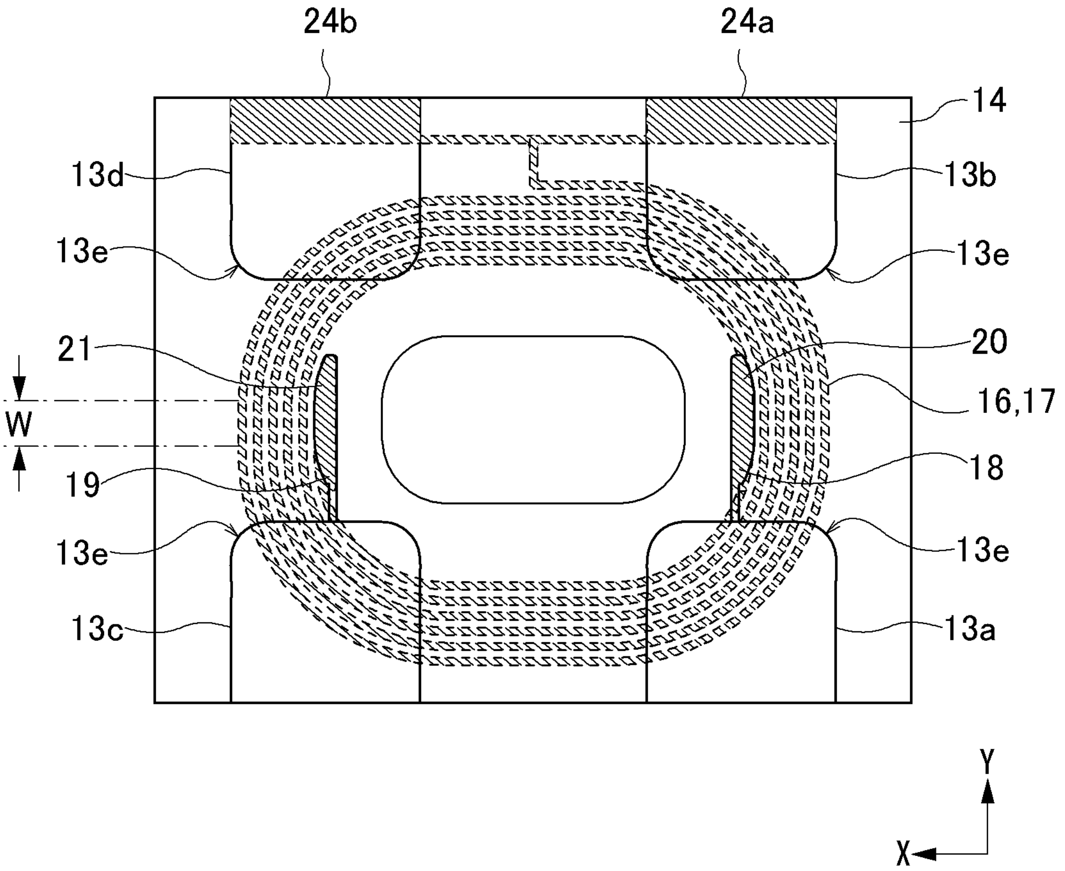
FIG. 4 is a schematic plan view showing a modification of the spiral conductor pattern.

FIG. 4 is a schematic plan view showing a modification of the spiral conductor pattern.

As shown in FIG. 4, the spiral conductors 16, 17 are characterized in that the loop size is enlarged in the Y direction by a width W. Accordingly, the area of the magnetic core 26 is increased. If, as described above, the terminal electrodes connected to the internal peripheral ends 16*a*, 17*a* of the first and second spiral conductors 16, 17 are omitted, a margin space is created in a region opposite to the terminal electrodes 24*a*, 24*b* and thus, like in the present embodiment, the loop size of the spiral conductor can be increased and also the cross section of the magnetic core 26 can be increased. Therefore, the common mode impedance Zc can be increased.

As described above, the coil component 100 according to the present embodiment is provided with the substrate 11 only on one side of the thin-film coil layer 12 and the substrate on the other side is omitted and instead, the insulator layer 14 is provided so that a thin-film chip component can be provided at a low cost. Also, by providing the bump electrodes 13*a* to 13*d* that are as thick as the insulator layer 14, a process to form an external electrode surface on the side face or the upper or lower surface of a chip component can be omitted so that an external electrode can be formed easily with high precision.

Further, in the coil component 100 according to the present embodiment, the lead conductors 20, 21 are formed on the surface of the thin-film coil layer 12 together with the bump electrodes 13*a* to 13*d*, the first lead conductor 20 is provided integrally in the same layer as the first bump electrode 13*a*, and the third lead conductor 21 is provided integrally in the same layer as the third bump electrode 13*c* and therefore, still thinner coil components can be provided. The distance between the insulator layer 14 and the thin-film coil layer 12 is brought closer to each other with the omission of an insulating layer needed to form the first and second lead conductors 20, 21 in the thin-film coil layer 12 so that the common mode impedance can be increased. Further, material costs and man-hours are reduced with the omission of a dedicated insulating layer and an independent lead conductor and therefore, coil components that can be manufactured at a low cost can be provided.

Next, a method of manufacturing the coil component 100 will be described in detail.

Figure 5:
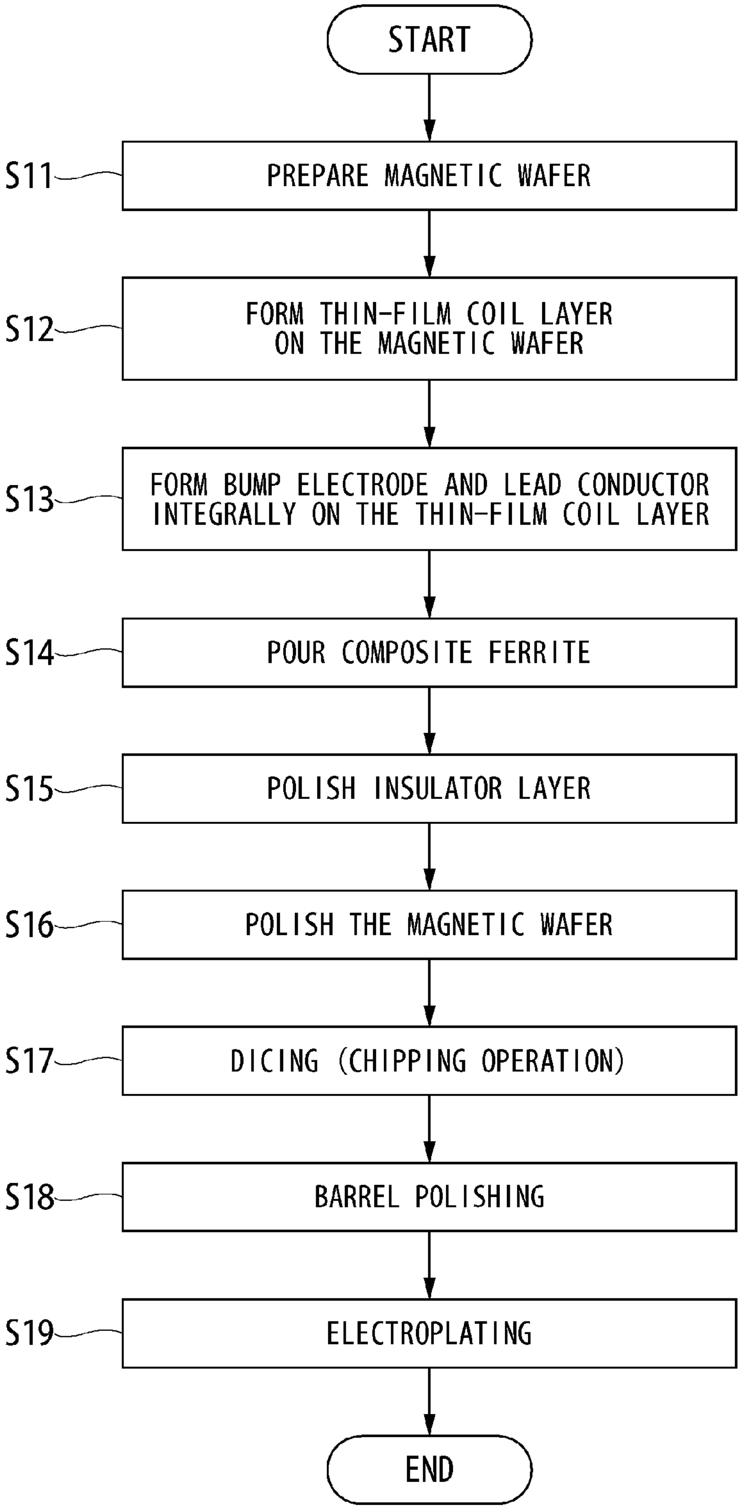
FIG. 5 is a flow chart showing a manufacturing method of the coil component 100.
Figure 6:
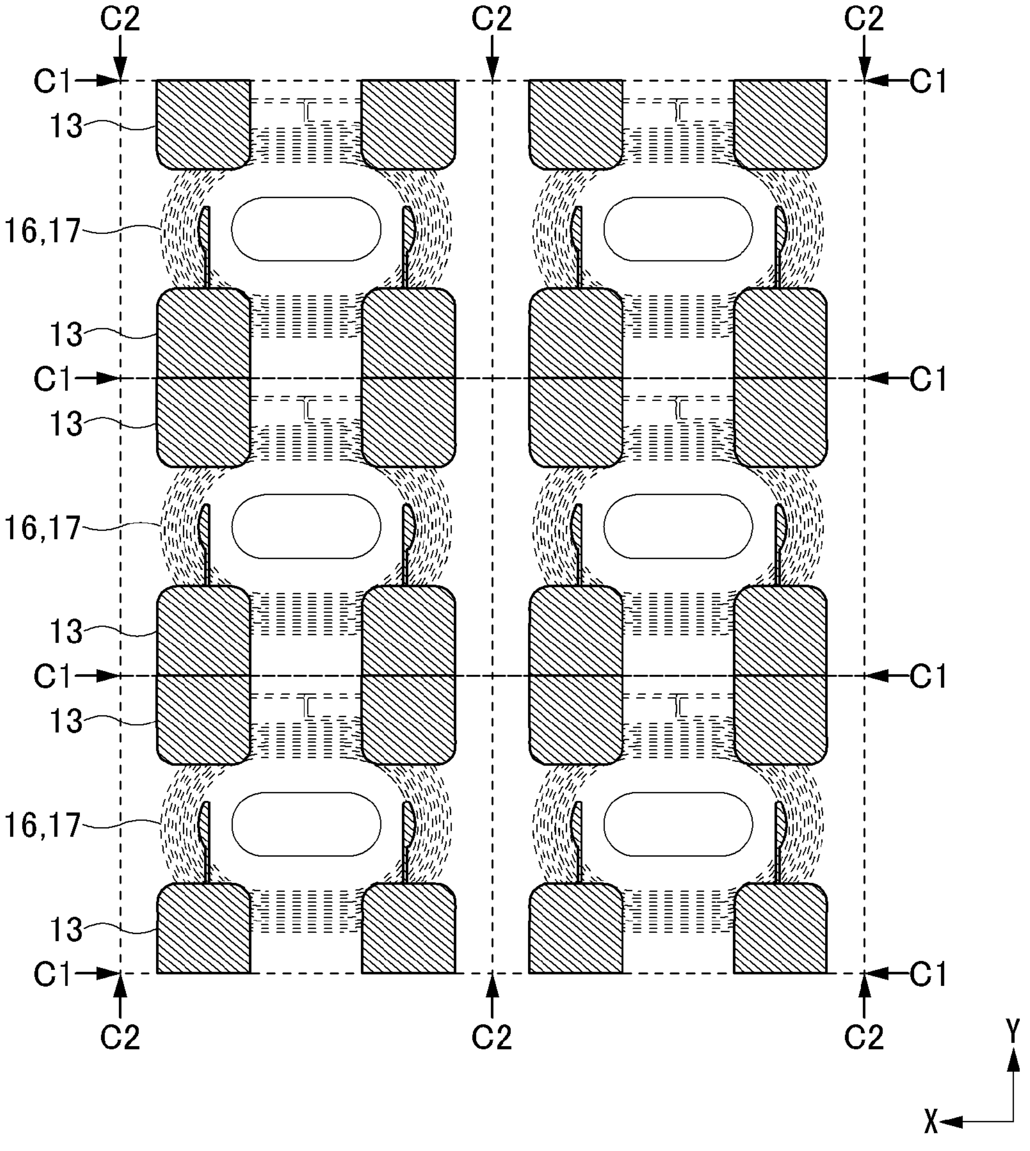
FIG. 6 is a schematic plan view showing the configuration of a magnetic wafer on which a large number of the coil components 100 are formed.

FIG. 5 is a flow chart showing a manufacturing method of the coil component 100. FIG. 6 is a schematic plan view showing the configuration of a magnetic wafer on which a large number of the coil components 100 are formed. Further, FIGS. 7A to 7E are schematic cross-sectional views illustrating formation processes of the bump electrodes 13*a*, 13*c* and the lead conductors 20, 21.

As shown in FIGS. 5 and 6, a mass-production process is performed for the manufacture of the coil component 100 in which a large number of common mode filter elements (coil conductor pattern) are formed on a large magnetic substrate (magnetic wafer) and then each element is individually cut to manufacture a large number of chip components. Thus, first a magnetic wafer is prepared (step S11) and the thin-film coil layer 12 on which a large number of common mode filter elements are laid out on the surface of the magnetic wafer is formed (step S12).

The thin-film coil layer 12 is formed by the so-called thin-film technology. The thin-film technology is a method by which a multilayer film in which an insulating film and a conductor layer are alternately formed is formed by repeating a process of applying a photosensitive resin to form the insulating layer by exposure and development thereof and then forming the conductor pattern on the surface of the insulating layer. The formation process of the thin-film coil layer 12 will be described in detail below.

In the formation of the thin-film coil layer 12, the insulating layer 15*a* is first formed and then, the first spiral conductor 16 and the terminal electrodes 24*a* to 24*d* are formed on the insulating layer 15*a*. Next, after the insulating layer 15*b* being formed on the insulating layer 15*a*, the second spiral conductor 17 and the terminal electrodes 24*a* to 24*d* are formed on the insulating layer 15*b* and further, the insulating layer 15*c* is formed on the insulating layer 15*b* (see FIG. 2).

Each of the insulating layers 15*a* to 15*c* can be formed by spin-coating the substrate surface with a photosensitive resin and exposing and developing the substrate surface. Particularly, a through-hole to form the opening 25 and the contact hole conductor 18 and openings corresponding to the terminal electrodes 24*a*, 24*b* are formed in the second insulating layer 15*b* and a through-hole to form the opening and the contact hole conductors 18, 19 and openings corresponding to the terminal electrodes 24*a*, 24*b* are formed in the third insulating layer 15*c*. Cu or the like can be used as the material of conductor patterns, which can be formed by forming a conductor layer by the vapor deposition or sputtering and then forming a patterned resist layer thereon and performing electroplating before the resist layer is removed.

Figure 7A:
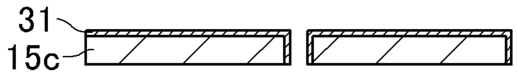
FIGS. 7A to 7E are schematic sectional views illustrating formation processes of the bump electrodes 13*a*, 13*c* and the lead conductors 20, 21.
Figure 7B:
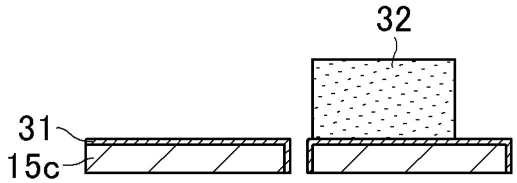

Next, the bump electrodes 13*a* to 13*d* and the first and second lead conductors 20, 21 are formed on the insulating layer 15*c*, which is the surface layer of the thin-film coil layer 12. As the formation method of the bump electrodes 13*a* to 13*d*, as shown in FIG. 7A, a base conductive film 31 is first formed on the entire surface of the insulting layer 15*c* by sputtering. Cu or the like can be used as the material of the base conductive film 31. Then, as shown in FIG. 7B, a dry film is pasted and then the dry film in positions where the bump electrodes 13*a* to 13*d* and the first and second lead conductors 20, 21 should be formed is selectively removed by exposure and development to form a dry film layer 32 (first mask) and to expose the base conductive film 31.

Figure 7C:
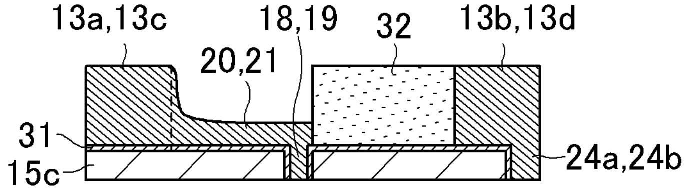

Next, as shown in FIG. 7C, electroplating is performed and exposed portions of the base conductive film 31 are grown to form the thick bump electrodes 13*a* to 13*d*. At this point, the through hole to form the contact hole conductors 18, 19 is filled with a plating material and the contact hole conductors 18, 19 are thereby formed. The openings to form the terminal electrodes 24*a*, 24*b* are also filled with a plating material and the terminal electrodes 24*a*, 24*b* are thereby formed. Further, the first and second lead conductors 20, are grown by plating, but plating growth thereof is incomplete because the line width of plating growth surface is narrow when compared with the bump electrodes 13*a* to 13*d* and the height thereof is lower than the bump electrodes 13*a* to 13*d*. The height of the first and second lead conductors 20, 21 changes a little depending on the position thereof and increases as the bump electrode is approached, but the average height is about 30 to 50% of the height of the bump electrode. The height of the lead conductors 20, 21 can intentionally be brought closer to the height of the bump electrodes 13*a* to 13*d* by adjusting plating conditions, but in the present embodiment, such control is not needed.

Figure 7D:
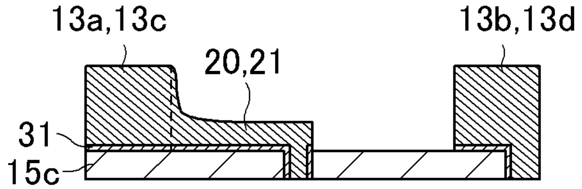

Then, as shown in FIG. 7D, the dry film layer 32 is removed and the unnecessary base conductive film 31 is removed by etching the entire surface to complete the bump electrodes 13*a* to 13*d* in a substantially columnar shape and the first and second lead conductors 20, 21. At this point, as shown in FIG. 6, the bump electrode 13 in a substantially columnar shape is formed as an electrode common to two chip components adjacent to each other in the illustrated Y direction. The bump electrode 13 is divided into two by dicing described later and the individual bump electrodes 13*a* to 13*d* corresponding to each element are thereby formed.

Figure 7E:
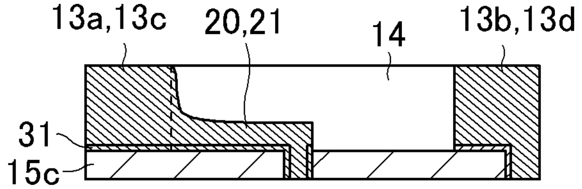

Next, as shown in FIG. 7E, a paste of composite ferrite is poured onto the magnetic wafer on which the bump electrode 13 is formed and cured to form the insulator layer 14 (step S14). At this point, a large amount of paste is poured to reliably form the insulator layer 14, thereby burying the bump electrodes 13*a* to 13*d* and the lead conductors 20, 21 under the insulator layer 14. Thus, the insulator layer 14 is polished until the upper surface of the bump electrodes 13*a* to 13*d* is exposed to have a predetermined thickness and also to make the surface thereof smooth (step S15). Further, the magnetic wafer is also polished to have a predetermined thickness (step S16).

The bump electrodes 13*a* to 13*d* are exposed by polishing of the insulator layer 14, but as described above, the first and second lead conductors 20, 21 are lower than the bump electrodes 13*a* to 13*d* and so, as shown in FIG. 7E, remain buried under the insulator layer 14 without being exposed to the surface thereof. Thus, in the present embodiment, only the bump electrodes 13*a* to 13*d* are exposed to the surface of the insulator layer 14 and therefore, a good-looking terminal electrode pattern as in the past can be provided.

Next, each common mode filter element is individualized (formed into chips) by dicing of the magnetic wafer to produce the chip component shown in FIG. 2 (step S17). In this case, as shown in FIG. 6, of a cutting line C1 extending in the X direction and a cutting line C2 extending in the Y direction, the cutting line C1 passes through the center of the bump electrode 13 and the obtained cut surface of the bump electrodes 13*a* to 13*d* is exposed to the side face of the coil component 100. Side faces of the bump electrodes 13*a* to 13*d* become a formation surface of a solder fillet during mounting and thus, fixing strength during soldering can be increased.

Next, after edges being removed by performing barrel polishing of chip components (step S18), electroplating is performed (step S19) to form a smooth electrode surface completely integrating the terminal electrodes 24*a*, 24*b* and the bump electrodes 13*b*, 13*d* exposed to the side face 10*b* side of the thin-film coil layer 12, thereby completing the bump electrodes 13*a* to 13*d* shown in FIG. 1. By performing barrel polishing of the outer surface of chip components as described above, coil components resistant to damage such as chipping can be manufactured. The surface of the bump electrodes 13*a* to 13*d* exposed on an outer circumferential surface of chip components is plated and thus, the surface of the bump electrodes 13*a* to 13*d* can be made a smooth surface.

According to the manufacturing method of the coil component 100 in the present embodiment, as described above, one of upper and lower magnetic substrates used traditionally is omitted and instead, the insulator layer 14 is formed and therefore, coil components can be manufactured easily at a low cost. Moreover, the insulator layer 14 is formed around the bump electrodes 13*a* to 13*d* and therefore, the bump electrodes 13*a* to 13*d* can be reinforced to prevent peeling of the bump electrodes 13*a* to 13*d* or the like. Also, according to the manufacturing method of the coil component 100 in the present embodiment, the bump electrodes 13*a* to 13*d* are formed by plating and therefore, compared with formation by, for example, sputtering, an external terminal electrode whose accuracy of finishing is higher and which is more stable can be provided. Further, according to the manufacturing method of the coil component 100 in the present embodiment, the lead conductors 20, 21 and the bump electrodes 13*a* to 13*d* are formed on the same plane by electroplating at a time and therefore, costs can be reduced by decreasing man-hours.

Figure 8:
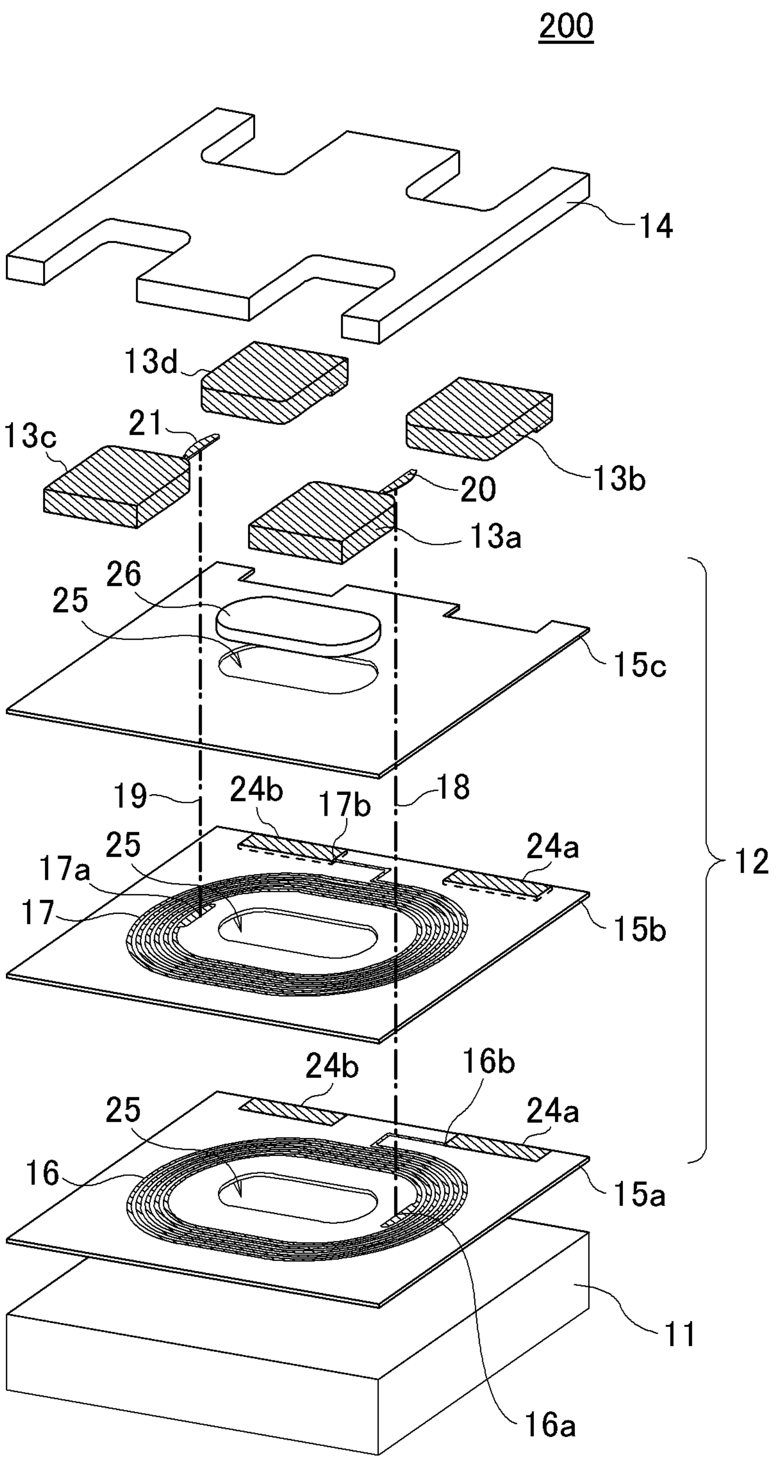
FIG. 8 is a schematic exploded perspective view showing a layer structure of a coil component 200 according to the second embodiment of the present invention.
Figure 9:
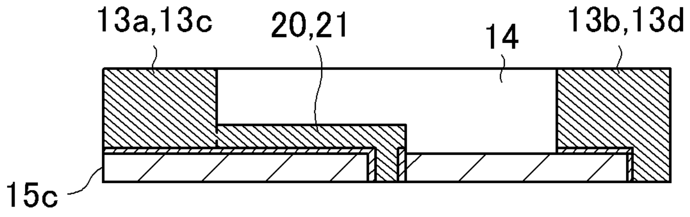
FIG. 9 is a schematic sectional view showing the structure of the bump electrode and the lead conductor.

FIG. 8 is a schematic exploded perspective view showing a layer structure of a coil component 200 according to the second embodiment of the present invention. FIG. 9 is a schematic sectional view showing the structure of the bump electrode and the lead conductor.

As shown in FIGS. 8 and 9, the coil component 200 is characterized in that the height (thickness) of the first and second lead conductors 20, 21 is rapidly lowered in a boundary with the bump electrodes 13*a* to 13*d*. The other configuration is substantially the same as the configuration of the coil component 100 according to the first embodiment and the same reference numerals are attached to the same elements and a detailed description thereof is omitted.

According to the coil component 200 in the present embodiment, in addition to the effects of the invention by the coil component 100, only the bump electrodes 13*a* to 13*d* can reliably be exposed from the bottom face of a chip component and the first and second lead conductors 20, 21 can reliably be buried under the insulator layer 14.

FIGS. 10A to 10G are schematic sectional views illustrating formation processes of the bump electrodes and the lead conductors. The manufacturing method of the coil component 200 will be described in detail below with reference to the flow chart in FIG. 5 along with FIGS. 10A to 10G.

In the manufacture of the coil component 200, first a magnetic wafer is prepared (step S11) and the thin-film coil layer 12 on which a large number of common mode filter elements are laid out on the surface of the magnetic wafer is formed. This is substantially the same as the coil component 100 according to the first embodiment and thus, a detailed description thereof is omitted.

Figure 10A:
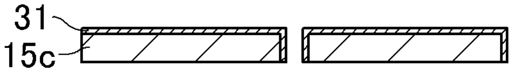
FIGS. 10A to 10G are schematic sectional views illustrating formation processes of the bump electrodes and the lead conductors.
Figure 10B:
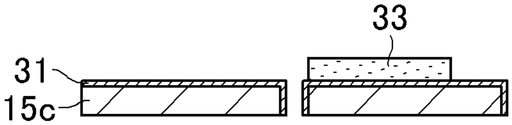

Next, the bump electrodes 13*a* to 13*d* and the first and second lead conductors 20, 21 are formed on the insulating layer 15*c* (step S13). As the formation method of the bump electrodes 13*a* to 13*d*, as shown in FIG. 10A, the base conductive film 31 is first formed on the entire surface of the insulting layer 15*c* by sputtering. Then, as shown in FIG. 10B, a photoresist is applied and then the photoresist in positions where the bump electrodes 13*a* to 13*d* and the first and second lead conductors 20, 21 should be formed is selectively removed by exposure and development to form a photoresist layer 33 (first mask) and to expose the base conductive film 31.

Figure 10C:
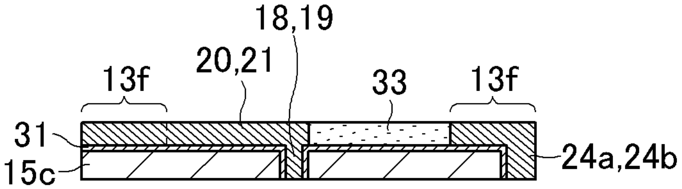

Next, as shown in FIG. 10C, the first electroplating is performed to grow an exposed portion of the base conductive film 31 to a thickness appropriate for the first and second lead conductors 20, 21. At this point, the through hole to form the contact hole conductors 18, 19 is filled with a conductive film and the contact hole conductors 18, 19 are thereby formed. The openings to form the terminal electrodes 24*a*, 24*b* are also filled with a plating material and the terminal electrodes 24*a*, 24*b* are thereby formed. Further, lower portions 13*f* of the bump electrodes are formed in formation positions of the bump electrodes 13*a* to 13*d*.

Figure 10D:
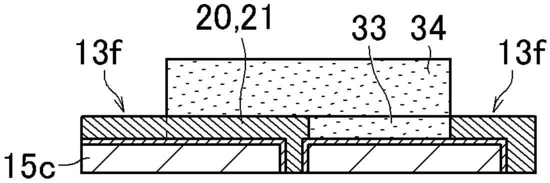

Then, as shown in FIG. 10D, a dry film is pasted and then the dry film in positions where the bump electrodes 13*a* to 13*d* and the first and second lead conductors 20, 21 should be formed is selectively removed by exposure and development to form a dry film layer 34 (second mask) and to expose the lower portions 13*f* of the bump electrodes 13*a* to 13*d* grown by plating up to a thickness appropriate for the lead conductors 20, 21.

Figure 10E:
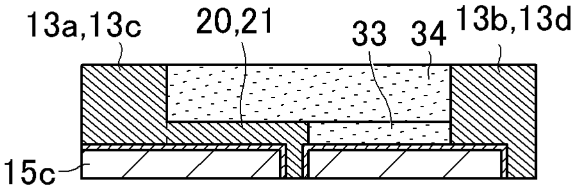

Next, as shown in FIG. 10E, the second electroplating is performed to further grow the lower portions 13*f* of the bump electrodes 13*a* to 13*d* to form the thick bump electrodes 13*a* to 13*d*. At this point, the lead conductors 20, 21 are covered with the dry film layer 34 and do not grow by plating.

Figure 10F:
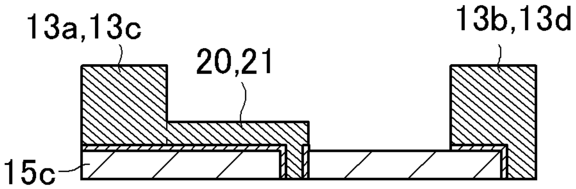

Then, as shown in FIG. 10F, the dry film layer 34 and the photoresist layer 33 are removed and the unnecessary base conductive film 31 is removed by etching the entire surface to complete the bump electrodes 13*a* to 13*d* in a substantially columnar shape and the first and second lead conductors 20, 21.

Figure 10G:
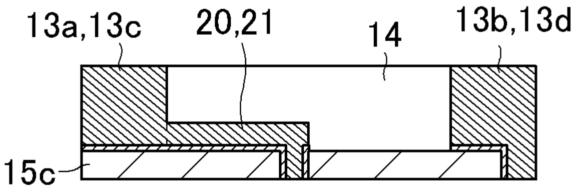

Next, as shown in FIG. 10G, a paste of composite ferrite is poured onto the magnetic wafer on which the bump electrodes 13*a* to 13*d* and lead conductors 20, 21 are formed and cured to form the insulator layer 14 (step S14). At this point, a large amount of paste is poured to reliably form the insulator layer 14, thereby burying the bump electrodes 13*a* to 13*d* and the lead conductors 20, 21 under the insulator layer 14. Thus, the insulator layer 14 is polished until the upper surface of the bump electrodes 13*a* to 13*d* is exposed to have a predetermined thickness and also to make the surface thereof smooth (step S15). Further, the magnetic wafer is also polished to have a predetermined thickness (step S16).

The bump electrodes 13*a* to 13*d* are exposed by polishing of the insulator layer 14, but as described above, the first and second lead conductors 20, 21 are certainly lower than the bump electrodes and so remain buried under the insulator layer 14 without being exposed to the surface thereof. Thus, in the present embodiment, only the bump electrodes 13*a* to 13*d* are exposed to the surface of the insulator layer 14 and therefore, a good-looking terminal electrode pattern as in the past can be provided.

Then, each common mode filter element is individualized (formed chips) by dicing of the magnetic wafer to produce the chip component shown in FIG. 8 (step S17). Further, after edges being removed by performing barrel polishing of chip components (step S18), electroplating is performed (step S19) to form a smooth electrode surface completely integrating the terminal electrodes 24*a*, 24*b* and the bump electrodes 13*b*, 13*d* exposed to the side face 10*b* side of the thin-film coil layer 12, thereby completing the bump electrodes 13*a* to 13*d* shown in FIG. 8.

According to the manufacturing method of the coil component 200 in the present embodiment, as described above, the electroplating process is divided into two processes and the height of the lead conductors 20, 21 are made significantly different from the height of the bump electrodes 13*a* to 13*d* and therefore, only the lead conductors 20, 21 can reliably be buried under the insulator layer 14 while the bump electrodes 13*a* to 13*d* being exposed and coil components having a good-looking terminal electrode pattern can reliably be manufactured.

While preferred embodiments of the present invention have been explained above, the present invention is not limited thereto. Various modifications can be made to the embodiments without departing from the scope of the present invention and it is needless to say that such modifications are also embraced within the scope of the invention.

In the above embodiments, for example, the thin-film coil layer 12 and the insulator layer 14 are formed on a magnetic wafer, the magnetic wafer is individualized by dicing, and further electroplating is performed after barrel polishing, but the present invention is not limited to the above method and dicing may be performed after the wafer before dicing is electrolessly plated.

Also in the above embodiments, the insulator layer 14 made of composite ferrite is formed on the principal surface of the thin-film coil layer 12, but the insulator layer 14 may also be formed of a non-magnetic material. The present invention can be applied to a coil component configured to connect the internal peripheral end of a spiral conductor and an external terminal electrode by a lead conductor and may be applied not only to a coil component of a 4-terminal structure, but also to a coil component of a 2-terminal structure.

The magnetic core 26 is provided in the above embodiments, but the magnetic core 26 is not mandatory. However, the magnetic core 26 can be formed of the same material as the material of the magnetic resin layer 14 and thus, the magnetic core 26 and the magnetic resin layer 14 can be formed simultaneously without undergoing a special process only if the opening 25 is formed.

EXAMPLES

As Example 1, a coil component having the configuration shown in FIG. 2 and the spiral conductor pattern shown in FIG. 4 is prepared and the common mode impedance Zc thereof is measured. As a result, the coil component according to Example 1 has Zc=86.5Ω.

Figure 11:
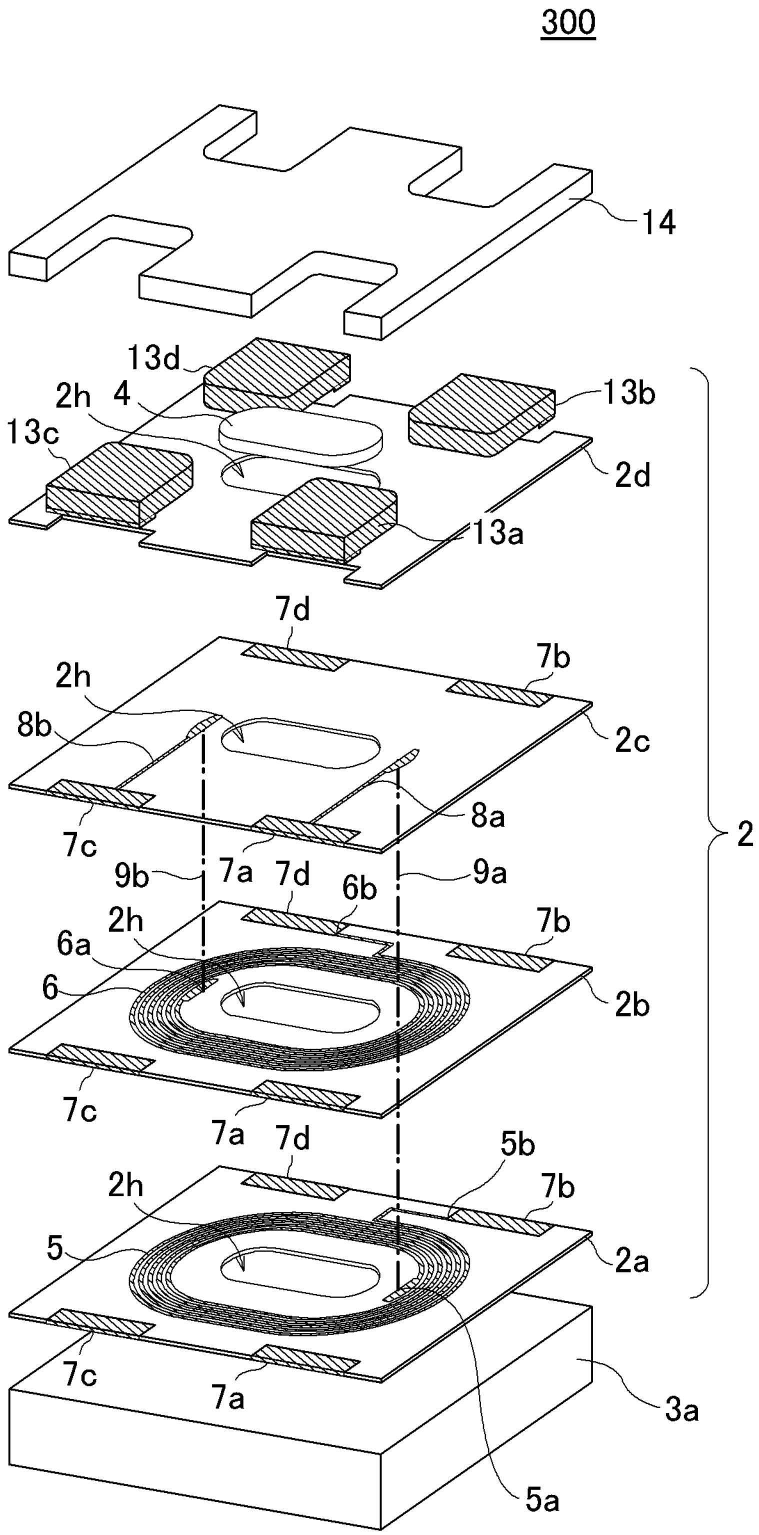
FIG. 11 is a schematic exploded perspective view showing the layer structure of an coil component 300 according to the comparative example.
Figure 12:
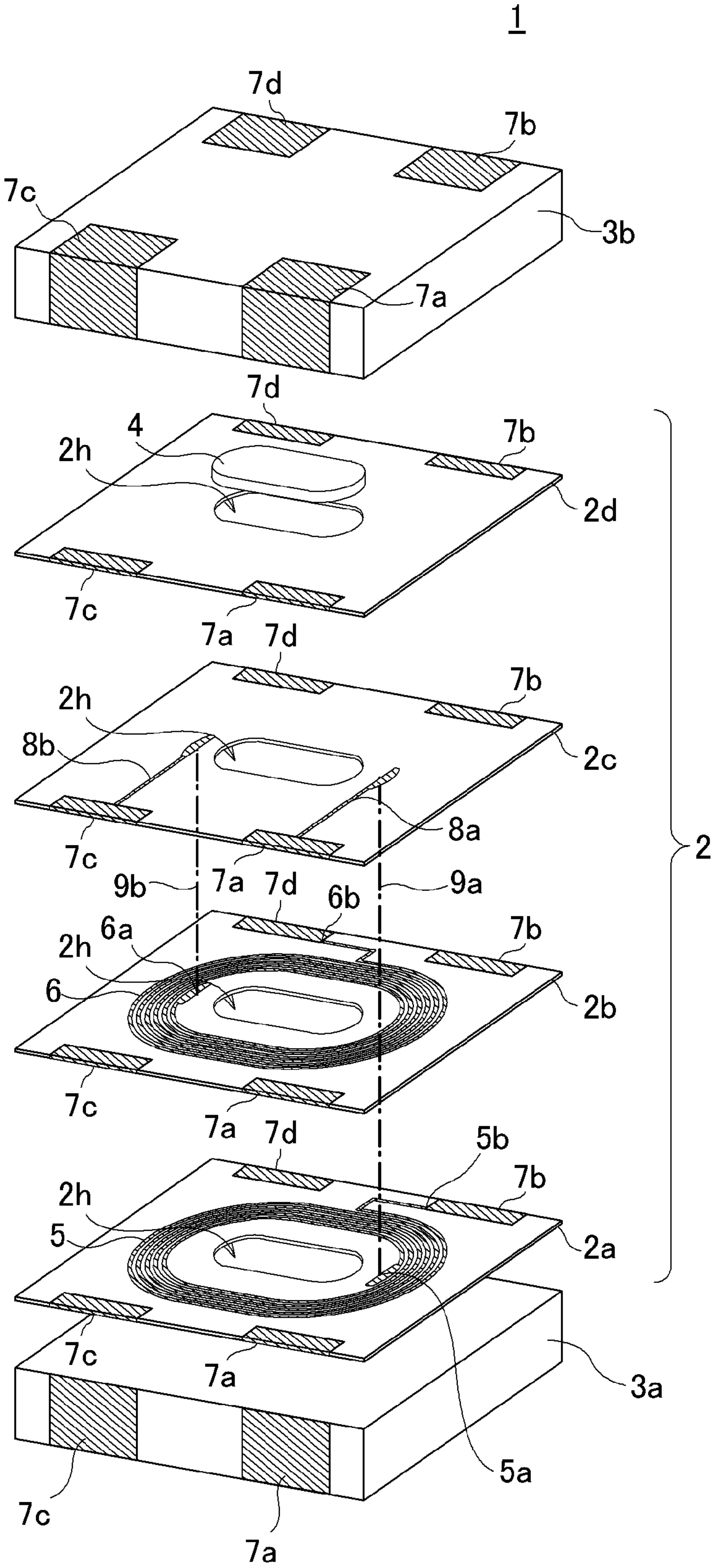
FIG. 12 is a schematic exploded perspective view showing an example of the structure of a conventional surface-mounted common mode filter.

On the other hand, the coil component 300 shown in FIG. 11 is prepared as a comparative example. The coil component 300 has the thin-film coil layer 2 configured in the same manner as in the conventional coil component 1 shown in FIG. 12 and the bump electrodes 13*a* to 13*d* similar to those of the coil component 100 shown in FIG. 2 on each of the external terminal electrodes 7*a* to 7*d*, and does not have the leading electrodes 20, 21 in FIG. 2. Then, the common mode impedance Zc of the coil component 300 is measured. The coil component 300 of the comparative example has the same chip size as Example 1 and a different configuration of the magnetic substrate 3*b* and the lead conductors 8*a*, 8*b* from the configuration of Example 1. As a result of measurement, the coil component according to the comparative example has Zc=85.4Ω. From the above result, the coil component according to Example 1 is verified that properties are improved with an increase of Rdc by 1.4% compared with the comparative example.

As Example 2, a coil component with a spiral conductor pattern obtained by increasing the width of coils of the spiral conductors 16, 17 of the thin-film coil layer 2 shown in FIG. 3 by 8% and shifting the spiral conductors 16, 17 and the opening 25 in the −Y direction while retaining the shape of the opening 25 is prepared and the DC resistance Rdc thereof is measured. As a result, the coil component according to Example 2 has Rdc=2.77Ω.

On the other hand, measurement of the DC resistance Rdc of the coil component 300 of the above comparative example shows that Rdc=2.95Ω. From the above result, the coil component according to Example 2 is verified that properties are improved with a reduction of Rdc by 6.1% compared with the comparative example.

What is claimed is:

1. A coil component comprising:

a substrate;

a thin-film coil layer provided on the substrate;

first and second bump electrodes provided on a surface of the thin-film coil layer;

a first lead conductor provided on the surface of the thin-film coil layer together with the first and second bump electrodes and formed integrally with the first bump electrode; and an insulator layer provided between the first bump electrode and the second bump electrode, wherein the thin-film coil layer contains a first spiral conductor which is a plane coil pattern, the first bump electrode is connected to an internal peripheral end of the first spiral conductor via the first lead conductor, and the second bump electrode is connected to an external peripheral end of the first spiral conductor.

2. The coil component as claimed in claim 1, wherein a height of the first lead conductor is lower than that of the first bump electrode.

3. The coil component as claimed in claim 1, wherein the first bump electrode and the second bump electrode have the same plane shape.

4. The coil component as claimed in claim 1 further comprising:
third and fourth bump electrodes provided on the surface of the thin-film coil layer; and
a second lead conductor provided on the surface of the thin-film coil layer together with the third and fourth bump electrodes and formed integrally with the third bump electrode, wherein
the thin-film coil layer further contains a second spiral conductor composed of a plane coil pattern magnetically coupled to the first spiral conductor,
the insulator layer is provided between the first to fourth bump electrodes,
the third bump electrode is connected to an internal peripheral end of the second spiral conductor via the second lead conductor, and
the fourth bump electrode is connected to an external peripheral end of the second spiral conductor.

5. The coil component as claimed in claim 1, wherein said surface includes a top surface of the thin-film coil layer, and
the first and second bump electrodes and the first lead conductor are provided on the top surface of the thin-film coil layer.

6. The coil component as claimed in claim 5, wherein the insulator layer is provided on the top surface of the thin-film coil layer.

7. The coil component as claimed in claim 6, wherein the insulator layer fills a first space between the first bump electrode and the second bump electrode.

8. The coil component as claimed in claim 5 further comprising:
third and fourth bump electrodes provided on the top surface of the thin-film coil layer; and
a second lead conductor provided on the top surface of the thin-film coil layer together with the third and fourth bump electrodes and formed integrally with the third bump electrode, wherein
the thin-film coil layer further contains a second spiral conductor composed of a plane coil pattern magnetically coupled to the first spiral conductor,
the insulator layer is provided between the first to fourth bump electrodes,
the third bump electrode is connected to an internal peripheral end of the second spiral conductor via the second lead conductor, and
the fourth bump electrode is connected to an external peripheral end of the second spiral conductor.

9. The coil component as claimed in claim 8, wherein the insulator layer is provided on the top surface of the thin-film coil layer.

10. The coil component as claimed in claim 9, wherein the insulator layer fills a second space between the first to fourth bump electrodes.

11. A method of manufacturing a coil component, comprising the steps of:
forming a thin-film coil layer containing a spiral conductor, which is a plane coil pattern, on a substrate; and
forming a bump electrode and a lead conductor on the thin-film coil layer, wherein
the step of forming the bump electrode and the lead conductor includes the steps of
forming a base conductive film on a surface of the thin-film coil layer and
forming the bump electrode and the lead conductor at the same time by, after a first region excluding a predetermined region to form the bump electrode and the lead conductor being covered with a first mask, growing the base conductive film in a region where the bump electrode should be formed to a predetermined thickness appropriate for the bump electrode by plating.

12. The method of claim 11, wherein the bump electrode and the lead conductor are formed on a top surface of the thin-film coil layer.

13. The method of claim 12, further comprising forming an insulator layer on the top surface of the thin-film coil layer.

14. A method of manufacturing a coil component, comprising the steps of:
forming a thin-film coil layer containing a spiral conductor, which is a plane coil pattern, on a substrate; and
forming a bump electrode and a lead conductor on the thin-film coil layer, wherein
the step of forming the bump electrode and the lead conductor includes the steps of
forming a base conductive film on a surface of the thin-film coil layer,
forming a lower part of the bump electrode and the lead conductor at the same time by, after a first region excluding a predetermined region to form the bump electrode and the lead conductor being covered with a first mask, growing an exposure portion of the base conductive film to a predetermined thickness appropriate for the lead conductor by plating, and
growing the lower part of the bump electrode to a predetermined thickness appropriate for the bump electrode by plating after a second region excluding the predetermined region to form the bump electrode being covered with a second mask.

15. The method of claim 14, wherein the bump electrode and the lead conductor are formed on a top surface of the thin-film coil layer.

16. The method of claim 15, further comprising forming an insulator layer on the top surface of the thin-film coil layer.

* * * * *